United States Patent
Goodwin et al.

(10) Patent No.: US 6,375,476 B1
(45) Date of Patent: Apr. 23, 2002

(54) LGA PACKAGE SOCKET

(75) Inventors: Jonathan W. Goodwin, Briantree, MA (US); Roy Burton, Memphis, TN (US)

(73) Assignee: Thomas & Betts International, Inc., Sparks, NV (US)

( * ) Notice: Subject to any disclaimer, the term of this patent is extended or adjusted under 35 U.S.C. 154(b) by 0 days.

(21) Appl. No.: 09/556,075

(22) Filed: Apr. 21, 2000

(51) Int. Cl.⁷ .................... H01R 12/00; H05K 1/00
(52) U.S. Cl. ................................................ 439/71
(58) Field of Search ................ 439/70, 71; 361/719

(56) References Cited

U.S. PATENT DOCUMENTS

| | | | | |
|---|---|---|---|---|
| 5,288,236 A | * | 2/1994 | McIntyre | 439/70 |
| 5,448,449 A | * | 9/1995 | Bright et al. | 361/704 |
| 5,473,510 A | * | 12/1995 | Dozier, II | 361/719 |
| 5,542,468 A | * | 8/1996 | Lin | 165/80.3 |
| 5,713,744 A | * | 2/1998 | Laub | 439/71 |
| 5,870,288 A | * | 2/1999 | Chen | 361/704 |

* cited by examiner

*Primary Examiner*—Khiem Nguyen
*Assistant Examiner*—Brian S. Webb
(74) *Attorney, Agent, or Firm*—Weingarten, Schurgin, Gagnebin & Lebovici LLP

(57) ABSTRACT

A socket for an LGA or BGA package is provided which is of relatively simple construction and which provides reliable and efficient interconnection of the package and a printed circuit board. The socket comprises a contact assembly having an array of resilient conductive columns having respective contact ends, the columns being mounted on a thin insulative sheet. The contact assembly is supported on a frame of insulating material and which has alignment posts for alignment of the contact assembly to the frame and for alignment of the frame and mounted contact assembly to an associated circuit board. The frame also includes elements for soldering or bonding the socket to a circuit board.

12 Claims, 6 Drawing Sheets

SURFACE MOUNT BONDED CONTACT (SBC) MPI SOCKET
FOR LGA TOP VIEW (PACKAGE SIDE)

LGA PACKAGE SOCKET

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

Well known forms of electronic packages are the land grid array (LGS) and ball grid array (BGA) package in which an electronic circuit, typically an integrated circuit, is contained within a thin rectangular housing having an array of electrical contacts on a surface of the package. Such a package is typically mounted to a corresponding array of contact areas of a printed circuit board. Since LGA or the BGA package is soldered directly to a circuit board, the package is not removable from the board without unsoldering. Sockets are known for removably mounting electronic circuit packages onto printed circuit boards; however, sockets for LGA or BGA packages have not heretofore been successfully implemented. Test sockets are known for testing such packages but such test sockets are generally complex and relatively large and cumbersome and are impractical for use in usual circuit board environments.

BRIEF SUMMARY OF THE INVENTION

In brief, a socket for an LGA or BGA package is provided which is of relatively simple construction and which provides reliable and efficient interconnection of an LGA or BGA package and a printed circuit board. The socket comprises a contact assembly having an array of resilient conductive columns having respective contact ends, the columns being mounted on a thin insulative sheet. The contact assembly is supported on a frame of insulating material and which has alignment posts for alignment of the contact assembly to the frame and for alignment of the frame and mounted contact assembly to an associated circuit board. The frame also includes elements for soldering or bonding the socket to a circuit board.

The socket is soldered or otherwise bonded onto a printed circuit board which has an array of contact areas corresponding to the array of resilient contacts of the socket. An LGA or BGA package is placed onto the socket frame and the package is maintained in alignment on the frame such that the package contacts engage the respective contacts of the contact assembly of the socket. The package is retained in the socket by a retention mechanism. The socket can include elements for preventing overstress of the resilient contacts.

The conductive columns can have the contact ends which engage the circuit board coated with a conductive polymer or other material which bonds to the contact areas of the circuit board. The other contact ends of the conductive columns which engage the package contacts do not bond to those package contacts so that the package remains removable from the socket.

BRIEF DESCRIPTION OF THE SEVERAL VIEWS OF THE DRAWINGS

The invention will be more fully understood from the following detailed description taken in conjunction with the accompanying drawings in which.

DETAILED DESCRIPTION OF THE INVENTION

Figure 1:
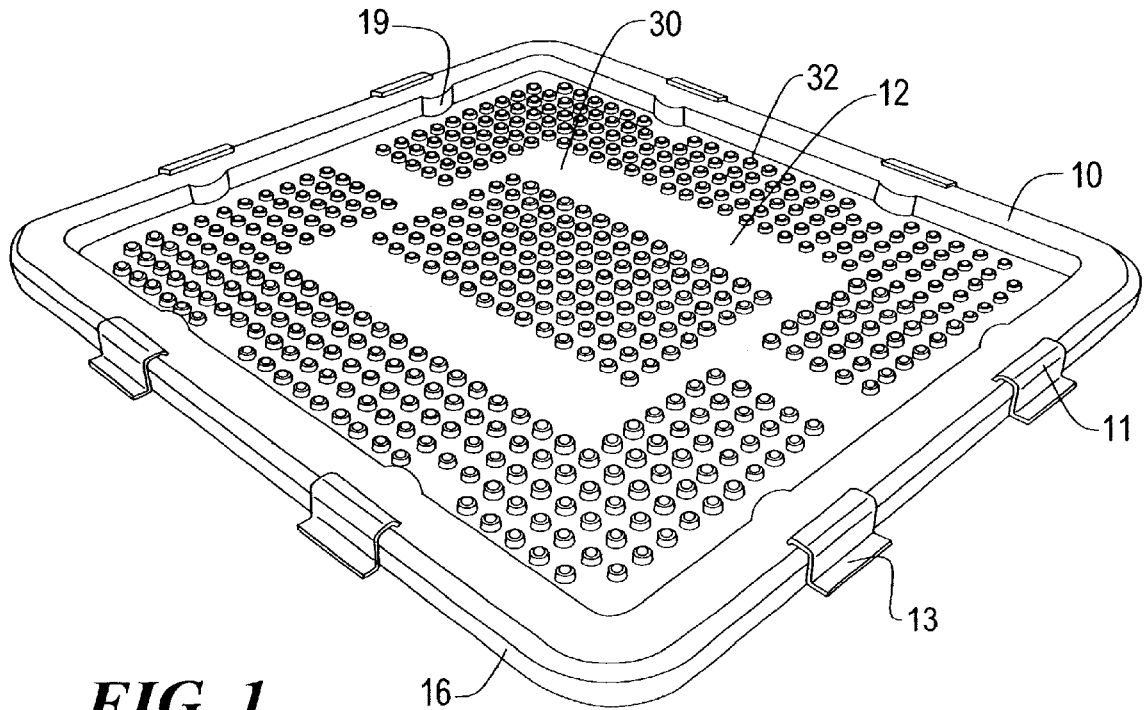
FIG. 1 is a pictorial top view of a socket in accordance with the invention.
Figure 2:
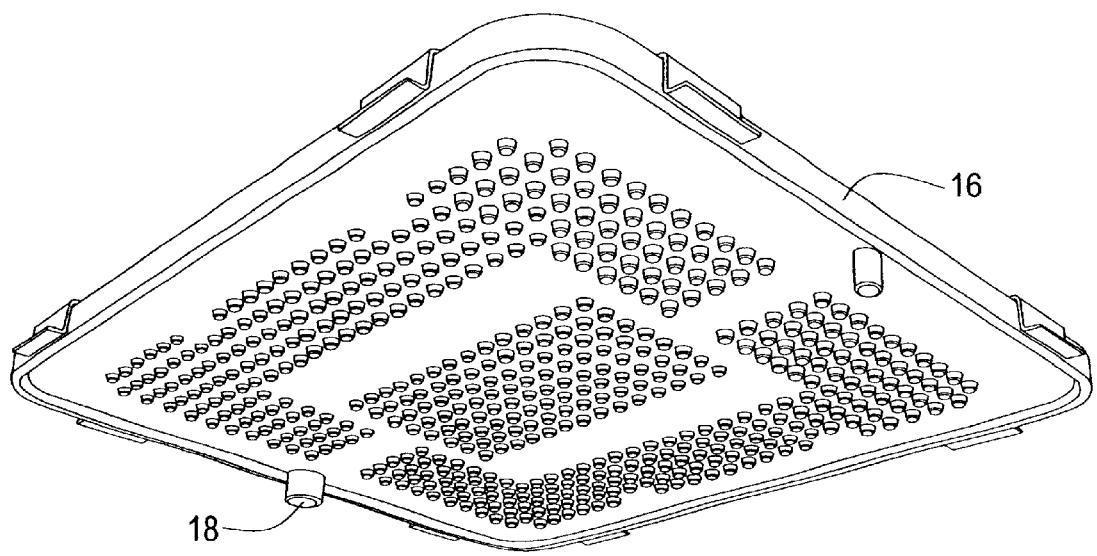
FIG. 2 is a bottom pictorial view of the socket of FIG. 1.
Figure 3:
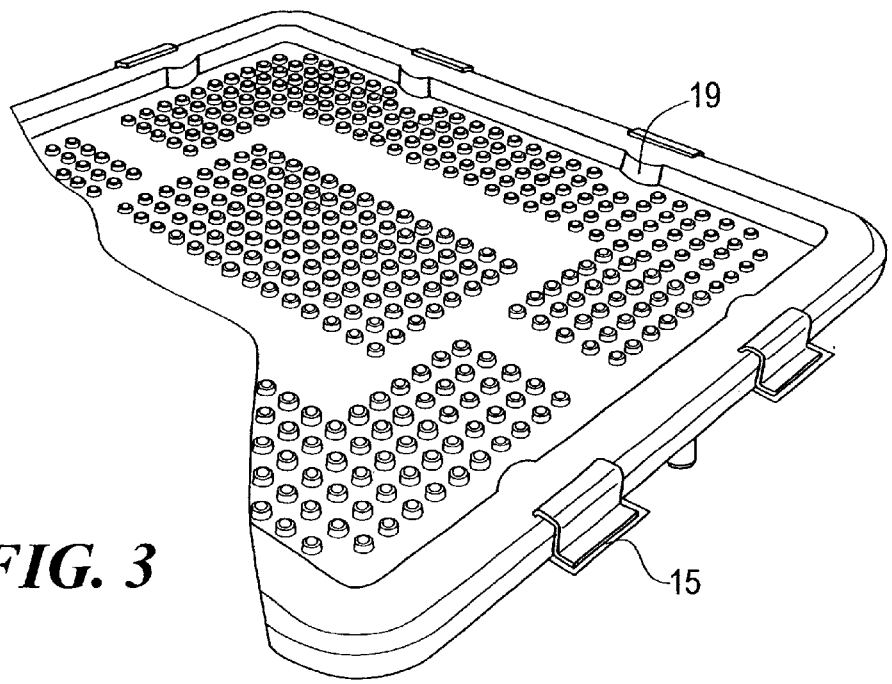
FIG. 3 is a cutaway pictorial view of the socket mounted on a circuit board.

Referring to FIGS. 1–3 of the drawings there is shown a socket for an LGA or BGA package which includes an insulator frame 10 and a contact assembly 12 retained in the frame. A plurality of clips 11 are mounted on the frame and are spaced about the periphery thereof. Each clip has an end secured in a slot in the frame and a spade end 13 which has a bottom surface coplanar with the bottom surface of the frame. The spade end is surface mounted to mounting areas 15 of a circuit board typically by soldering, as shown in FIG. 3. A package 14 (FIG. 7) is disposed on the insulator frame and is retained therein for electrical contact via the contact assembly to contacts on the circuit board.

The insulator frame 10 is of square or rectangular configuration in the illustrated embodiment and having a peripheral portion 16 and posts 18 for locating the frame on a circuit board. The locating posts are cooperative with respective openings in the contact assembly and are also cooperative with openings in the circuit board to which the socket is mounted for alignment of the socket to the circuit board.

Figure 4:
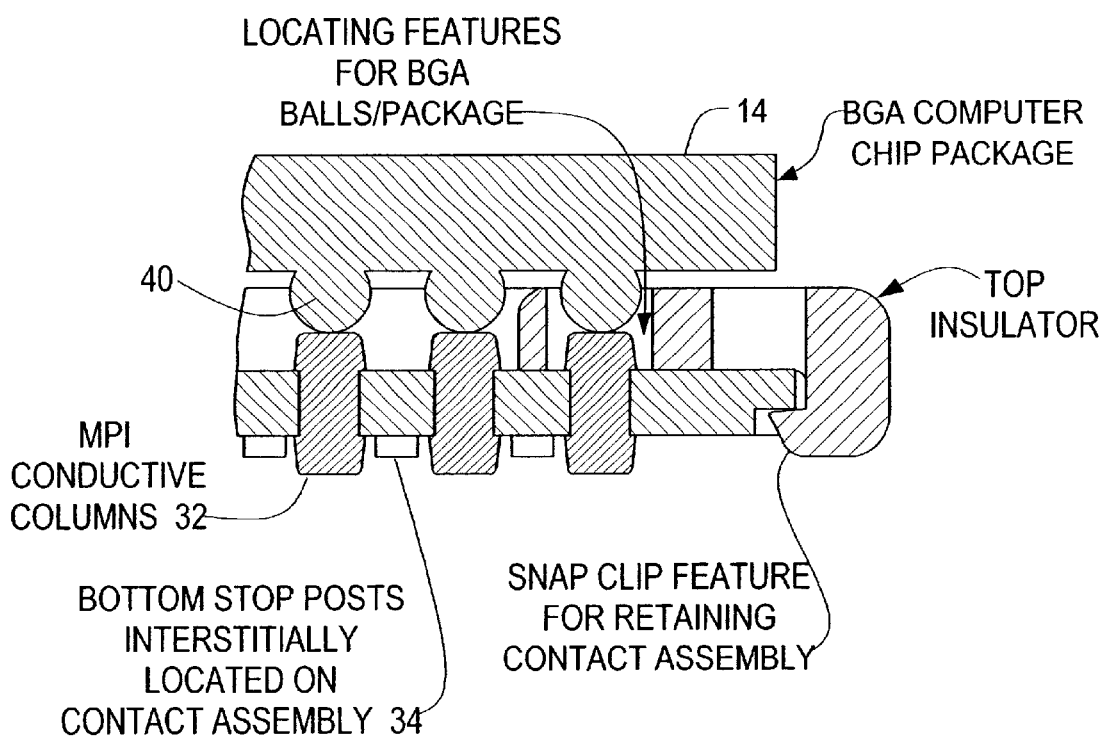
FIG. 4 is an enlarged cross-sectional view illustrating a package-mounted on the socket.

The contact assembly 12 is comprised of an insulating sheet 30 having an array of resilient conductive columns 32 disposed in respective openings through the sheet and having upper and lower contact ends. The conductive columns are preferably as shown in copending application Ser. No. 09/222,137, filed Dec. 29, 1998, assigned to the same assignee as this invention. The contact assembly may also includes stop posts 34 (FIG. 4) disposed between columns 32 to limit the amount of compression of the resilient conductive columns when the socket is mounted on a circuit board.

The conductive columns can have the contact ends which engage the circuit board coated with a conductive polymer or other material which bonds to the contact areas of the circuit board. The other contact ends of the conductive columns which engage the package contacts do not bond to those package contacts so that the package remains removable from the socket.

The socket is mounted on an associated circuit board and located on the board by means of locating posts 18, and is retained on the circuit board by spring clips 11 soldered or otherwise bonded to mounting areas of the circuit board. An LGA or BGA package 14 is disposed in the socket and retained within the frame by the inwardly extending areas 19 to retain the package in alignment with the package contacts in engagement with respective contact ends 32 of the conductive columns of the contact assembly 12. The bottom contact ends 32 of the conductive columns engage respective contacts on the circuit board.

Figure 5:
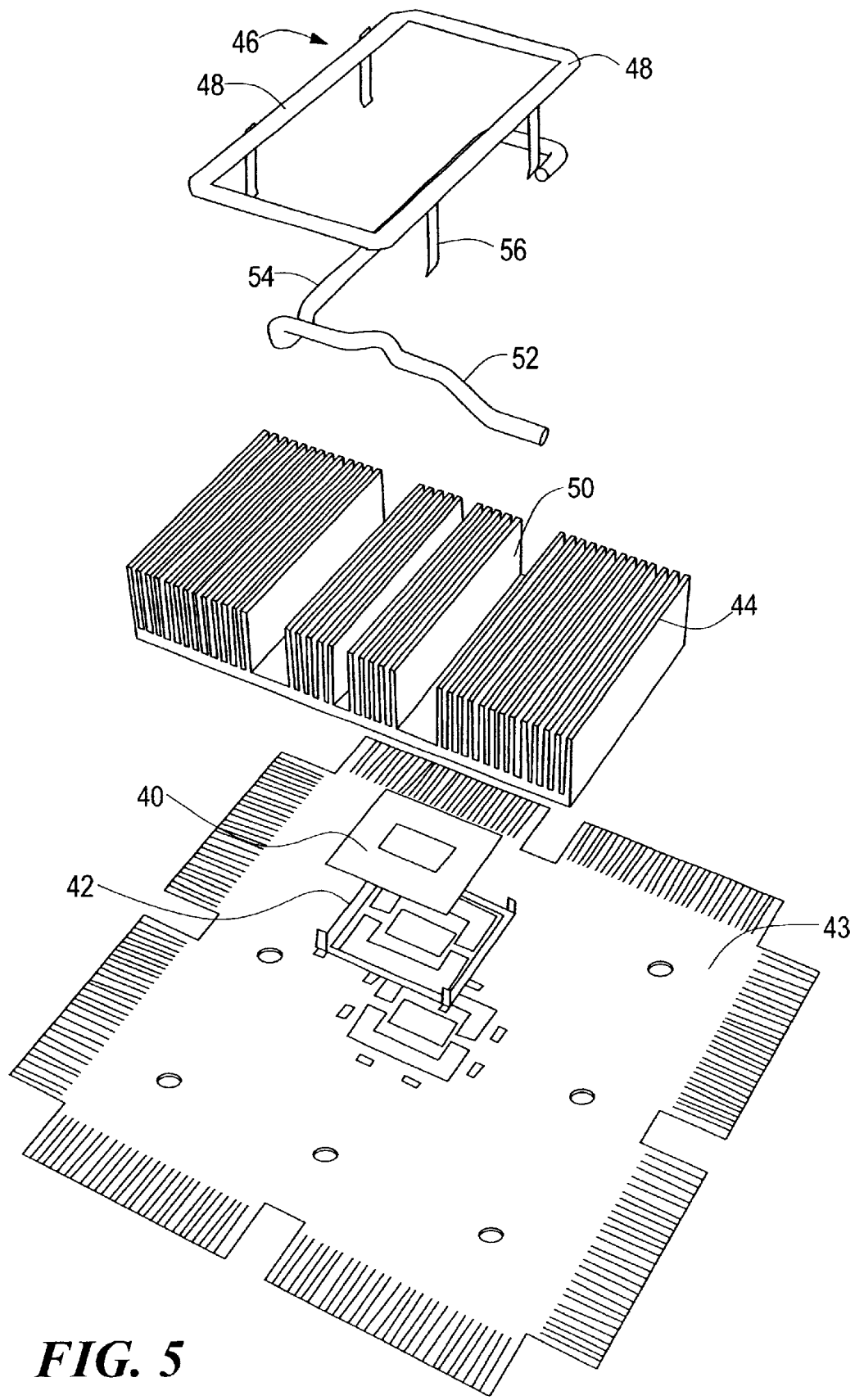
FIG. 5 is an exploded view illustrating the socket and retention mechanism.
Figure 6:
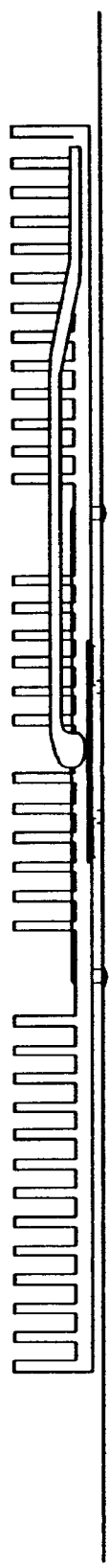
FIG. 6 is a side view of the heat sink and clamp of FIG. 5.

The package is retained on the socket in a preferred embodiment as shown in FIGS. 5 and 6 A package 40 is placed in the socket 42 which is mounted on circuit board 43. A heat sink 44 is disposed over the package and the assembly is retained by a spring assembly having a rectangular frame 46 with sides 48 that fit within the spaces 50 of the heat sink and a cam lever 52 which has a section 54 disposed within an opening in the heat sink and below the spring frame as shown. The spring frame includes downwardly extending fingers 56 which cooperate with openings in the circuit board to retain the spring in position. Upon lowered movement of the cam lever the spring frame is urged upward to provide engagement of the ends of the spring fingers with the circuit board to spring load the components of the assembly together and provide a compressive force on the package retained within the socket sufficient for proper electrical engagement between the package contact, contact assembly and circuit board contacts. Raising of the cam lever releases the force on the spring assembly permitting the spring frame to be removed and the heat sink to be removed for replacement of a package in the socket.

Figure 9:
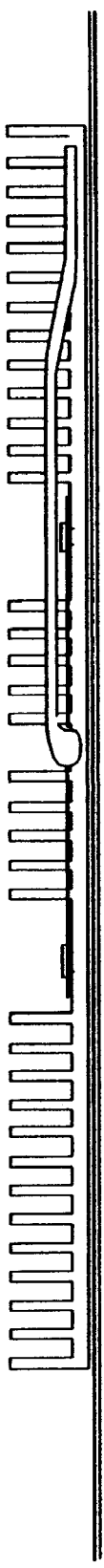
FIG. 9 is a side view of the heat sink and clamp of FIG. 8.
Figure 7:
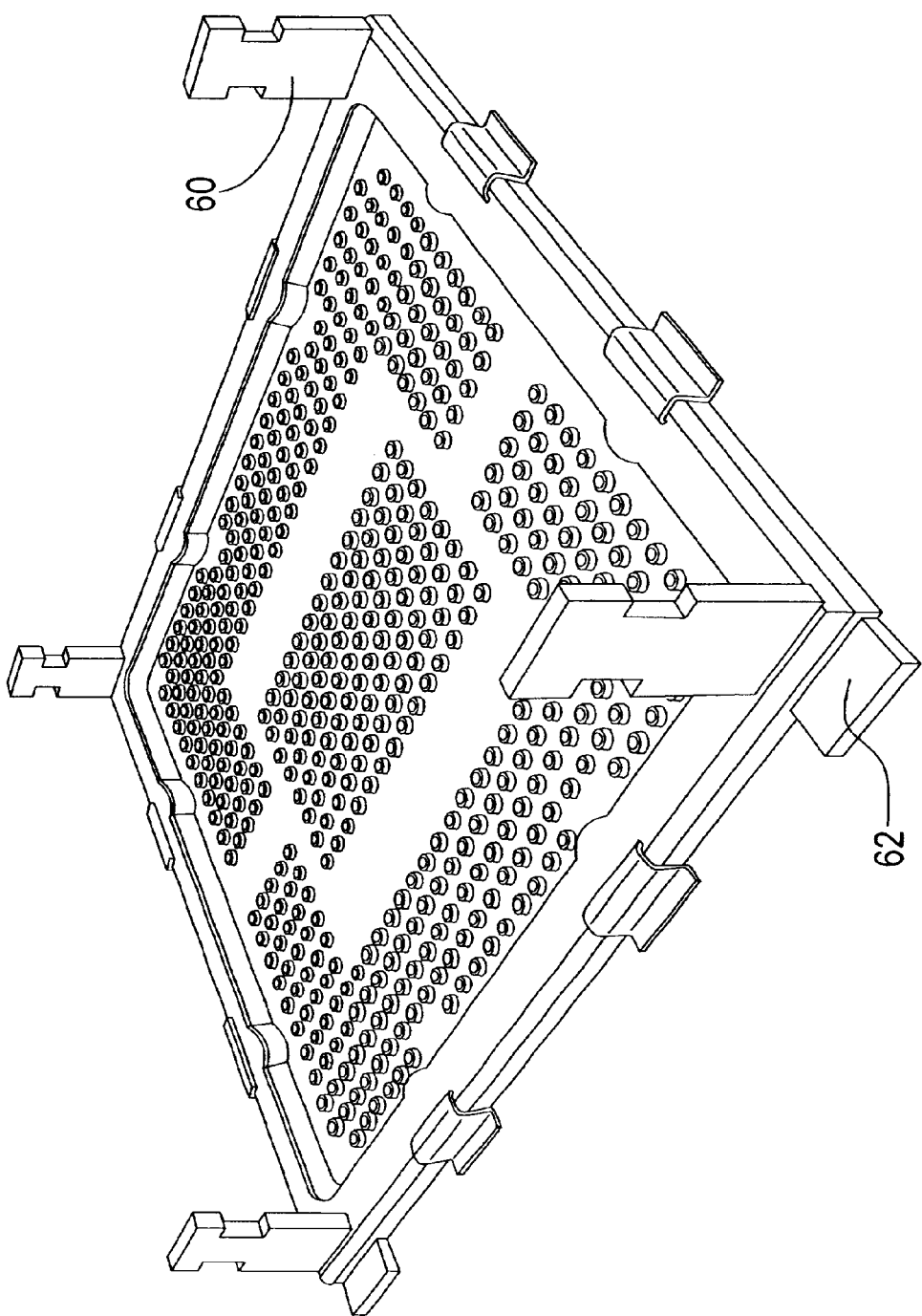
FIG. 7 is a pictorial top view of an alternative socket of the invention.
Figure 8:
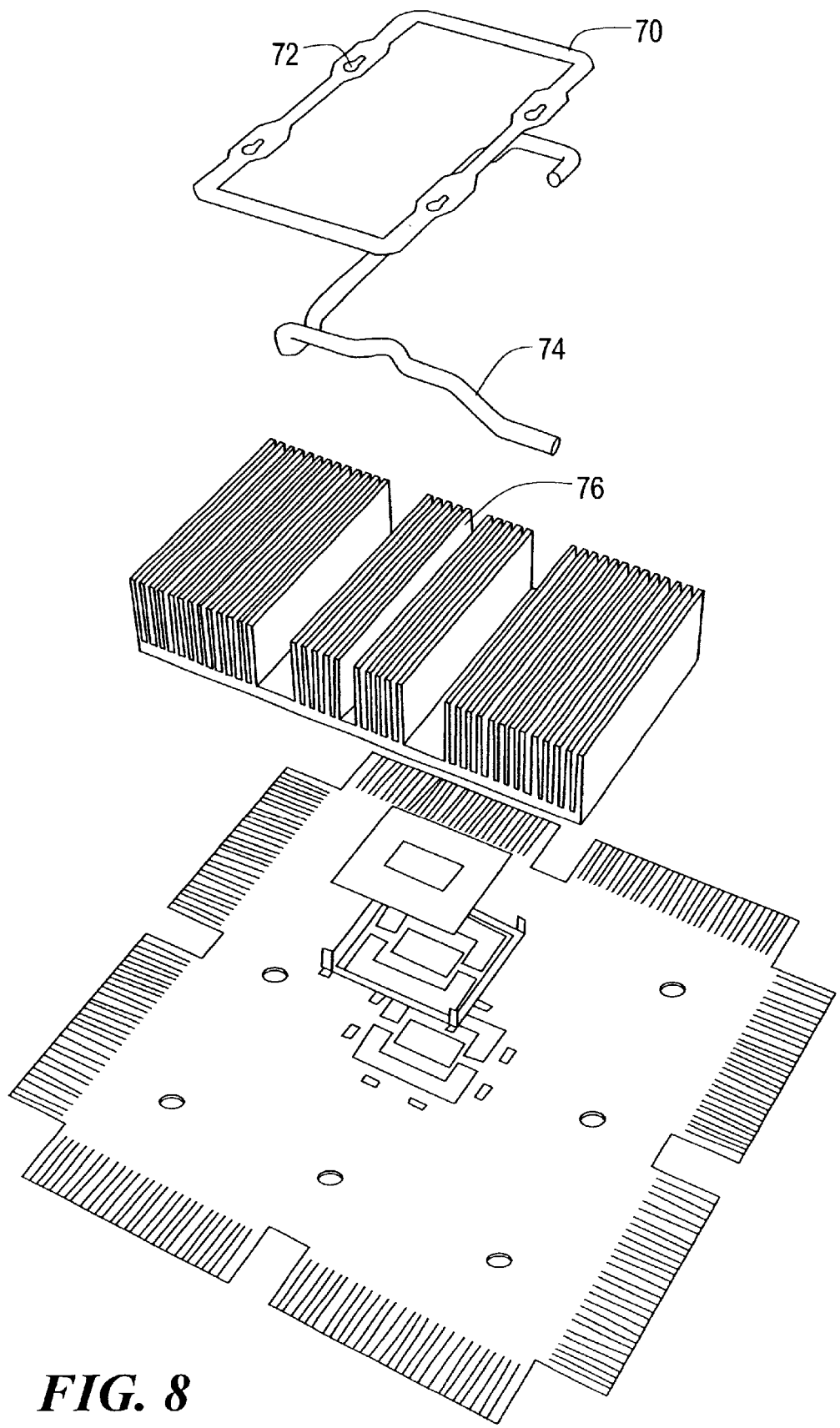
FIG. 8 is an exploded view of the socket of FIG. 7 and retention mechanism.

An alternative frame configuration is shown in FIG. 7 wherein posts 60 are provided at each corner of the frame having T-shaped notches as shown. The posts are preferably integrally formed with the frame. Alternatively the posts can be separate elements which are staked or otherwise retained in the frame. Additional mounting tabs 62 are provided at the corners of the frame as shown. The frame is soldered or otherwise bonded to mounting areas of a circuit board. The spring clips are also soldered or otherwise bonded to respective mounting areas of the board. A mounting arrangement for this embodiment is shown in FIGS. 8 and 9 and is similar to that described above with respect to FIGS. 5 and 6 except that the spring frame 70 includes openings 72 of keyhole shape which are cooperative with the upper ends of the corner posts of the frame to retain the spring frame in position. The keyhole openings are sized to have a larger part through which the upper ends of the posts can be inserted. After insertion the spring frame is moved to a position where the frame is secured to the posts with the post slots residing at the narrower ends of the keyhole openings. A cam lever 74 is disposed in an opening 76 in the heat sink below the spring frame, and upon movement downward of the cam lever the spring frame is urged upward against the T-shaped ends of the frame posts to lock the assembly together and provide a compressive force on the package and contacts of the contact assembly.

The invention should not be limited by what has been particularly shown and described but is to embrace the spirit and full scope of the appended claims.

What is claimed is:

1. A socket for an LGA or BGA package comprising:
   a contact assembly having an array of resilient conductive columns having respective contact ends and an insulative sheet on which the conductive columns are mounted;
   a frame of insulating material having first elements for alignment of the frame to the contact assembly, second elements for alignment of the socket to an associated circuit board, and third elements for alignment of a package on the socket;
   a plurality of clips disposed about the periphery of the frame and having one end attached to the frame and a second end substantially coplanar with the bottom surface of the frame the second end of the clips configured to be surface mountable to an associated circuit board.

2. The socket of claim 1 wherein the first end of each of the clips includes one or more retention elements for securing the clip to the frame of insulating material;
   and wherein the second end of each of the clips has a flat area solderable to a mounting area of the associated circuit board.

3. The socket of claim 2 wherein each of the clips is formed of a metal.

4. The socket of claim 3 wherein each of the clips includes on the second end thereof a reflow solderable material.

5. The socket of claim 1 wherein the contact ends of the array of resilient conductive columns which engage contacts of an associated circuit board include contact material which bonds to the contact areas of the contacts of the associated circuit board.

6. The socket of claim 1 wherein the contact ends of the resilient conductive columns are coated with conductive polymer.

7. The socket of claim 5 wherein the contact material is conductive polymer bondable to the contact areas of the associated circuit board.

8. The socket of claim 1 including apparatus for retaining an LGA or BGA package on the socket.

9. The socket of claim 8 wherein the apparatus includes:
   a heat sink disposable over the package contained on the socket; and
   a spring assembly having a frame cooperative with the heat sink and a cam mechanism operative to retain the heat sink on the package.

10. The socket of claim 9 wherein the spring assembly frame includes:
    fingers cooperative with openings in the circuit board to retain the spring assembly frame in position; and
    wherein the cam mechanism is operative to urge the spring assembly frame upward to engage the fingers with the circuit board and to spring load the package on the socket.

11. The socket of claim 8 wherein the apparatus includes:
    a plurality of posts upward extending from respective corners of the frame of insulating material, each of the posts having a notch;
    a heat sink disposable over the package contained on the socket;
    a spring assembly having a spring frame cooperative with the notches in the posts and a cam mechanism operative to retain the heat sink on the package.

12. A socket for an LGA or BGA package comprising:
    a contact assembly having an array of resilient conductive columns having respective contact ends and an insulative sheet on which the conductive columns are mounted;
    a frame of insulating material having first elements for alignment of the frame to the contact assembly, second elements for alignment of the socket to an associated circuit board, and third elements for alignment of a package on the socket;
    a plurality of conductive clips disposed about the periphery of the frame and having one end attached to the frame and a second end substantially coplanar with the bottom surface of the frame the second end of the clips configured to be surface mountable to an associated circuit board;
    the contact ends which engage the circuit board being coated with a conductive material which bonds to the contact areas of the circuit board; and
    the contact ends which engage the package contacts being removably engageable with the package contacts.

* * * * *

UNITED STATES PATENT AND TRADEMARK OFFICE
CERTIFICATE OF CORRECTION

PATENT NO. : 6,375,476 B1
DATED : April 23, 2002
INVENTOR(S) : Jonathan W. Goodwin et al.

It is certified that error appears in the above-identified patent and that said Letters Patent is hereby corrected as shown below:

<u>Title page,</u>
Item [75], Inventors, "Briantree" should read -- Braintree --.

Signed and Sealed this

Eleventh Day of February, 2003

JAMES E. ROGAN
*Director of the United States Patent and Trademark Office*